United States Patent
Chang et al.

(10) Patent No.: US 7,494,370 B2
(45) Date of Patent: Feb. 24, 2009

(54) MEMORY DEVICE

(75) Inventors: Arthur Chang, Taipei (TW);
Chang-Jen Ho, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 168 days.

(21) Appl. No.: 11/366,428

(22) Filed: Mar. 3, 2006

(65) Prior Publication Data
US 2006/0198177 A1    Sep. 7, 2006

(30) Foreign Application Priority Data
Mar. 3, 2005    (TW) ............... 94106504 A

(51) Int. Cl.
*H01R 13/60* (2006.01)
(52) U.S. Cl. .................................... 439/502
(58) Field of Classification Search ............... 439/502, 439/528, 505; 235/492
See application file for complete search history.

(56) References Cited

U.S. PATENT DOCUMENTS 6,790,077 B1 * 9/2004 Chen ................... 439/502
7,300,306 B2 * 11/2007 Le et al. ............... 439/502
2006/0134962 A1 * 6/2006 Yeh ..................... 439/352

FOREIGN PATENT DOCUMENTS

CN        1304115 A       7/2001
JP        2003-282206  *  3/2003

OTHER PUBLICATIONS

Derwint 2005-258598, KR2004100112, Dec. 2004.*
Derwint 2005-301814, KR2004104943 Dec. 2004.*

* cited by examiner

*Primary Examiner*—Neil Abrams
(74) *Attorney, Agent, or Firm*—Rabin & Berdo, PC

(57) ABSTRACT

A memory device comprising a main body, a first connect head, a transmission wire and a second connect head is provided. A memory is disposed inside the main body for storing digital data. The first connect head is disposed at one end of the main body and electrically connected to the memory. The transmission wire has a first end and a second end. The first end is electrically connected to the memory via the other end of the main body, while the second end is electrically connected to the second connect head. The second connect head can be attached to or detached from the first connect head to form a necklace-like shape that may be worn or easily carried.

8 Claims, 2 Drawing Sheets

MEMORY DEVICE

This application claims the benefit of Taiwan application Serial No. 094106504, filed Mar. 3, 2005, the subject matter of which is incorporated herein by reference.

BACKGROUND OF THE INVENTION

1. Field of the Invention

The invention relates in general to a memory device, and more particularly to a memory device used as an augmented memory of the portable electronic device.

2. Description of the Related Art

Portable electronic products, such as mobile phones, MP3 players, personal digital assistances (PDA) and digital cameras for instance, have gained a great popular interest nowadays. As the portable devices are featured by lightweight, slimness, compactness and versatile functions, the need for the storage and sharing of multi-media information is growing rapidly. It is a great challenge to provide an information storage medium with smaller volume, lower power consumption and a larger storage capacity.

Most of the current portable electronic devices adopt a flash memory card to enlarge the capacity of memory for storing or sharing multi-media information. The flash memory card has a variety of types, and memory cards with various specifications are applicable to different electronic devices. Compact flash (CF) card is the earliest and most popular product in flash memory cards, so almost every digital camera and PDA has a CF augmentation port. Despite the CF card is slow in reading and writing speed, it is the cheapest one of memory cards in the market. Smart media (SM) card is smaller in volume size and faster in reading and writing speed than the CF card. SM card is suited for use in parts of the portable electronic products for Japanese specifications. The manufacturers present a multi media card (MMC) whose size is equivalent to but slightly thicker than the SM card. New style MMC card overcomes the shortcoming of the slow speed of the CF card in reading and writing, but is applicable to fewer electronic devices and has higher price than the CF card. As the urge of the protection of digital copyright is attracting more attention, the secure digital (SD) card, which is similar to appearance of the MMC card and equipped with encryption and high-speed transmission functions, is provided. Moreover, the hardware that supports the SD card is also compatible with the MMC card. Apart from the above mentioned memory card, there are a variety of memory cards for reduced-size, such as Mini SD card and reduced-size multi-media card (RS-MMC). Beside, the memory stick (MS) presented by the Sony Corporation is exclusively applicable to Sony portable electronic devices including PDA, video camera, digital camera, and so forth.

No matter which memory card disclosed above is used, when data have to be transmitted between two different electronic devices, a card reading machine will be needed if one of the electronic device lacks a suitable read-write socket. A card-reading machine is required to transmit the photos stored in the memory card of the digital camera to the computer, since most computers in the commercial market aren't equipped with a socket compactable for the flash memory card. Therefore, it is inconvenient for the user to transmit the data stored in the flash memory card to the electronic devices incapable of reading flash memory cards (including CF card, SM card, MMC card, SD card, and MS card) directly.

SUMMARY OF THE INVENTION

The invention provides a memory device and the applications thereof. The memory device having two connect heads can be used as an augmented memory of a portable electronic products or a data transmission medium between two electronic devices.

According to an embodiment of the invention, a memory device comprising a main body, a first connect head, a transmission wire and a second connect head is provided. A memory is disposed inside the main body for storing digital data. The first connect head is disposed at one end of the main body and electrically connected to the memory. The transmission wire has a first end and a second end. The first end is electrically connected to the memory via the other end of the main body; while the second end is electrically connected to the second connect head. The second connect head can be attached to or detached from the first connect head.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides a portable memory device, which can be used as a random access device of a portable electronic device or as a data transmission medium between two electronic devices.

Figure 1:
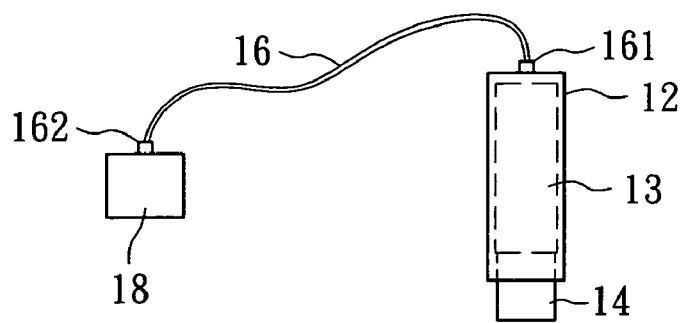
FIG. 1 is a diagram of a memory device according to a preferred embodiment of the invention.

Referring to FIG. 1, a diagram of a memory device according to a preferred embodiment of the invention is shown. The memory device 10 comprises a main body 12, a first connect head 14, a transmission wire 16 and a second connect head 18. A memory 13 is disposed inside the main body 12 for storing digital data. The first connect head 14 is disposed at one end of the main body 12 to be electrically connected to the memory 13. The transmission wire 16 has a first end 161 and a second end 162. The first end 161 is electrically connected to the memory 13 via the other end of the main body 12, while the second end 162 is electrically connected to the second connect head 18. Besides, the second connect head 18 can be attached to or detached from the first connect head 14. An example of the first connect head 14 is a universal serial bus (USB) plug.

The applications of the memory device of the invention are versatile. The first and second applications are presented to illustrate the functions and advantages of memory device 10 in the practical operation.

First Application

Figure 2:
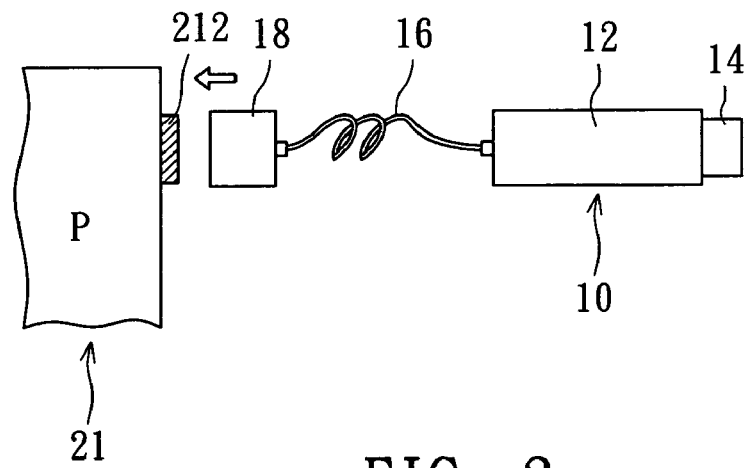
FIG. 2 is a diagram of a memory device and a portable electronic device according to a first application of the invention.

FIG. 2 is a diagram of a memory device and a portable electronic device according to a first application of the invention. The portable electronic device 21, such as mobile phone, MP3 player, PDA, or digital camera for instance, has a connector 212, which can be electrically connected to the second connect head 18 correspondingly.

In the first application, the second connect head 18 of the memory device 10 is electrically connected to the connector 212 of the portable electronic device 21. The electrically connected memory device 10 can be used as an augmented memory of the portable electronic device 21. The electronic device 21 can read the data stored in the memory device 10 directly.

Practically, when the memory device 10 is not needed, the second connect head 18 can be correspondingly coupled to the first connect head 14, and the assembled memory device 10 can be received in the pocket or the hand bag, or worn around the neck of the user via the transmission wire 16.

Second Application

Figure 3:
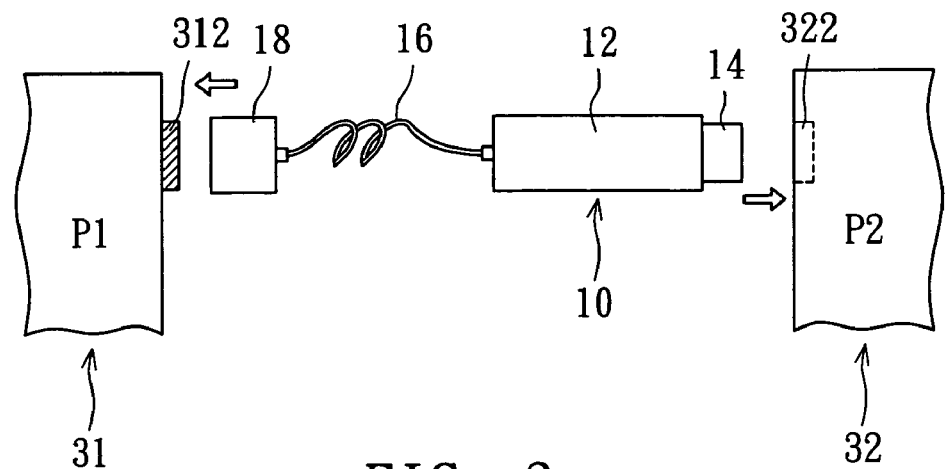
FIG. 3 is a diagram of a memory device and an electronic device according to a second application of the invention.

FIG. 3 is a diagram of a memory device and an electronic device according to a second application of the invention. The first electronic device 31, such as a portable electronic device (P1, such as a mobile phone, MP3 player, PDA, or digital camera), has a first connector 312, which can be electrically connected to the second connect head 18 correspondingly. The second electronic device 32 (P2), such as a computer or other portable electronic product, has a second connector 322, which can be electrically connected to the first connect head 14 correspondingly. Examples of the first connect head 14 and the second connector 322 are a USB plug and a USB socket, respectively.

In the second application, the first connect head 14 and the second connect head 18 of the memory device 10 are respectively electrically connected to the second connector 322 of the second electronic device 32 and the first connector 312 of the first electronic device 31. After electrical connection, the memory device 10 is used as a data transmission medium between the first electronic device 31 and the second electronic device 32.

For example, the first electronic device 31 can be a mobile phone or a digital camera. The large amount of photos shot by the first electronic device 31 can be transmitted to be stored in the memory device 10 via the second connect head 18 and the transmission wire 16; meanwhile, the memory of the first electronic device 31 is expanded by the memory device 10. When the user would like to download the photos stored in the memory device 10 to the computer for further editing or for permanent storage (such as burning the photos in an optical disc), the memory device 10 can be electrically connected to the second electronic device 32 (such as a computer) via the first connect head 14 without using any card reading machine. Accordingly, the memory device 10 not only expands the capacity of the first electronic device 31 but also functions as a data transmission medium for the convenience of use.

Figure 4:
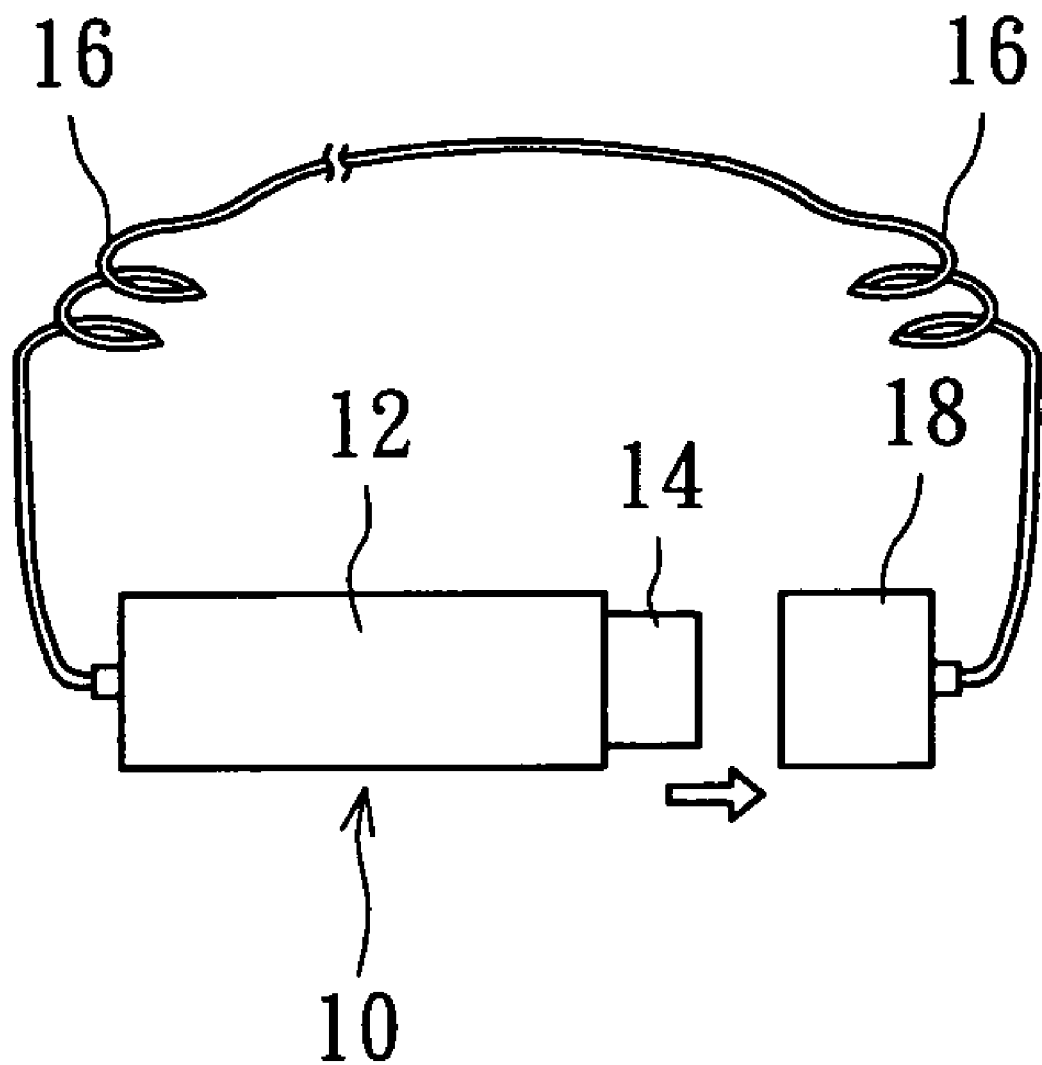
FIG. 4 is a diagram showing a first and a second connect head of the memory device according to a preferred embodiment of the invention being coupled correspondingly.

FIG. 4 is a diagram showing a first and a second connect heads of the memory device according to a preferred embodiment of the invention being coupled correspondingly. In the first and the second applications, the second connect head 18 can be correspondingly coupled to the first connect head 14 to be received in the pocket or the hand bag or worn around the neck of the user via a transmission wire 16 when the memory device 10 is not needed.

According to the aforementioned description, the memory device of the invention and the applications thereof not only is small in size and low in power consumption, but also makes the storage and sharing of multi-media information easier.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a main body, having a memory formed therein, the memory being adapted to preserve data for retrieval;
   a first connect head disposed at one end of the main body and electrically connected to the memory;
   a transmission wire having a first end and a second end, the first end of the transmission wire being electrically connected to the memory via the other end of the main body; and
   a second connect head electrically connected to the second end of the transmission wire,
   wherein the second connect head is adapted to be attached to the first connect head by fitting to each other to form a necklace-like shape, or detached from the first connect head.

2. The memory device according to claim 1, wherein the first connect head is a universal serial bus (USB) plug.

3. The memory device according to claim 1 applicable to an electronic device, wherein the electronic device has a connector to be electrically connected to the second connect head of the memory device.

4. The memory device according to claim 1, wherein the first connect head and the second connect head are respectively electrically connected to two electronic devices.

5. A memory device, applied to a portable electronic device having a connector, and the memory device comprising:
   a main body, having a memory formed therein, the memory being adapted to preserve data for retrieval;
   a first connect head disposed at one end of the main body and electrically connected to the memory;
   a transmission wire having a first end and a second end, the first end of the transmission wire being electrically connected to the memory via the other end of the main body; and
   a second connect head electrically connected to the second end of the transmission wire, wherein the second connect head is adapted to be attached to the first connect head by fitting to each other to form a necklace-like shape, or detached from the first connect head;
   when the first connect head or the second connect head is electrically connected to the connector of the portable electronic device, the memory device is an augmented memory of the portable electronic device.

6. The memory device according to claim 5, wherein the second connect head is electrically connected to the connector of the portable electronic device, and the first connect head is electrically connected to another electronic device.

7. The memory device according to claim 6, wherein the first connect head is a universal serial bus (USB) plug and correspondingly inserted into a USB socket of another electronic device.

8. The memory device according to claim 6, wherein the connector of the portable electronic device is a USB plug.

* * * * *